United States Patent
Chang

(10) Patent No.: US 11,488,776 B2
(45) Date of Patent: Nov. 1, 2022

(54) THERMOELECTRIC ELECTROCHEMICAL CONVERSION DEVICES

(71) Applicant: Yu-Che Chang, Taoyuan (TW)

(72) Inventor: Yu-Che Chang, Taoyuan (TW)

( * ) Notice: Subject to any disclaimer, the term of this patent is extended or adjusted under 35 U.S.C. 154(b) by 39 days.

(21) Appl. No.: 16/915,924

(22) Filed: Jun. 29, 2020

(65) Prior Publication Data

US 2021/0020362 A1    Jan. 21, 2021

Related U.S. Application Data

(60) Provisional application No. 62/874,488, filed on Jul. 15, 2019.

(51) Int. Cl.
| | |
|---|---|
| *H01G 9/035* | (2006.01) |
| *H01G 11/56* | (2013.01) |
| *H01G 2/08* | (2006.01) |
| *H01G 9/042* | (2006.01) |
| *H01L 35/02* | (2006.01) |

(52) U.S. Cl.
CPC .............. *H01G 2/08* (2013.01); *H01G 9/035* (2013.01); *H01G 9/042* (2013.01); *H01G 11/56* (2013.01); *H01L 35/02* (2013.01)

(58) Field of Classification Search
None
See application file for complete search history.

(56) References Cited

U.S. PATENT DOCUMENTS

| | | | |
|---|---|---|---|
| 6,296,783 B1* | 10/2001 | Shindo | H01B 1/122 |
| | | | 526/167 |
| 6,620,994 B2 | 9/2003 | Rossi | |
| 9,177,721 B2* | 11/2015 | Amatucci | H01G 9/10 |
| 2011/0045346 A1* | 2/2011 | Chiang | H01G 11/06 |
| | | | 429/199 |
| 2011/0186101 A1 | 8/2011 | Melanson | |
| 2013/0276850 A1 | 10/2013 | Crispin et al. | |
| 2014/0087214 A1* | 3/2014 | Amatucci | H01G 11/80 |
| | | | 429/11 |
| 2015/0130472 A1 | 5/2015 | Jun et al. | |
| 2016/0308195 A1* | 10/2016 | Mui | H01G 11/72 |
| 2017/0005367 A1* | 1/2017 | Van Berkel | H01M 50/446 |
| 2017/0200570 A1* | 7/2017 | Ciocanel | H01G 11/26 |
| 2017/0317374 A1* | 11/2017 | Takahashi | H01M 50/443 |
| 2018/0068803 A1* | 3/2018 | Brambilla | H01G 11/56 |
| 2018/0211794 A1* | 7/2018 | Brambilla | H01G 11/60 |

(Continued)

FOREIGN PATENT DOCUMENTS

WO    WO-2019046886 A1 *    3/2019    ............. H01G 11/52

OTHER PUBLICATIONS

Lee, "Low-Grade Heat Conversion into Electricity by Thermoelectric and Electrochemical Systems", Doctoral Thesis, Massachusetts Institute of Technology, Aug. 2018, pp. 1-217.

(Continued)

*Primary Examiner* — Dion R. Ferguson

(74) *Attorney, Agent, or Firm* — Liu & Liu

(57) ABSTRACT

A heat capacitor with simple structure, easy to manufacture and high thermoelectric conversion efficiency is provided. The heat capacitor includes: a pair of electrodes, at least one said electrode being a carbonaceous electrode; and a thermoelectric electrolyte disposed between the pair of electrodes, wherein the distance between the pair of electrodes is at most 1 mm.

10 Claims, 6 Drawing Sheets

(56) References Cited

U.S. PATENT DOCUMENTS

2019/0371536 A1* 12/2019 Miles .................... H05K 3/007
2020/0099097 A1*  3/2020 Li ...................... H01M 10/0568
2020/0286688 A1*  9/2020 Banerjee ................ H01G 11/32

OTHER PUBLICATIONS

Wang, et al., "Ionic Thermoelectric Supercapacitors", Energy & Environmental Science, 9(4), (2016), pp. 1450-1457.

* cited by examiner

THERMOELECTRIC ELECTROCHEMICAL CONVERSION DEVICES

CROSS REFERENCE TO RELATED APPLICATIONS

The present application claims priority to U.S. provisional Application No. 62/874,488, filed on Jul. 15, 2019, which is incorporated herein by reference in its entirety for all purposes.

FIELD OF THE INVENTION

The present disclosure relates to a thermoelectric conversion device and, more particularly, to a heat capacitor with simple structure, easy to manufacture and high thermoelectric conversion efficiency.

BACKGROUND OF THE INVENTION

Thermoelectric (TE) devices are electronic devices for converting temperature differences into electrical energy and vice versa. A research topic which is increasingly becoming popular is the potential application of thermoelectric devices to power generation and temperature control. A common example of thermoelectric devices is a thermoelectric cooler (TEC) or thermoelectric generator (TEG) which operates by coupling and transmission between electrons and phonons.

Important characteristics of thermoelectric materials include thermoelectric figure-of-merit (ZT) which is directly related to the conversion efficiency of the thermoelectric devices. For a thermoelectric material to be high-efficiency, it must have high thermal diffusivity but low thermal conductivity. From the perspective of industrial application, the conventional ways of power generation can be thoroughly changed, if a thermoelectric device of ZT level higher than 1.4 is developed.

Conventional thermoelectric devices are mostly solid-state semiconductor devices, with p-type and n-type semiconductor pins connected by electrical series connection and thermal parallel connection. However, the solid materials for use as p-type and n-type semiconductors according to the prior art have a disadvantageous physical property, i.e., low conversion efficiency, to the detriment of their industrial application.

The prior art also discloses combining nano-printed thermoelectric materials and doping semiconductors, such that they have an electron-rich state or electron-depleted state and thereby satisfactory thermoelectric conversion efficiency. However, both the aforesaid two techniques have their own intractable drawbacks.

One of the advantages of nano-printed semiconductor structure lies in the promising nano-printing technology. However, with printing area requirement on the rise, properties of semiconductor structure are increasingly difficult to control. Doping mechanism still relies on expensive doping elements and harmful doping techniques to the detriment of its wide application.

The aforesaid drawbacks of solid-state thermoelectric semiconductor devices inspire researchers to study thermoelectric properties of polymeric electrolytes. For instance, US 2013/0276850 A1 discloses a thermoelectric device capable of converting a temperature difference into electrical energy according to two different electrolyte properties. The thermoelectric device is structurally complicated and requires a connector and at least one pin to transmit ions. Furthermore, the thermoelectric device not only requires a solid-state electrolyte soluble in water and dissociated therein but also requires a conductive polymer for electrical transmission of ions. In short, the thermoelectric device requires plenty, different constituent components to collect thermoelectric energy and charges its capacitors with the electrical power.

In Zhao, D., Wang, H., Ullah Khan, Z., Chen, J. C., Gabrielsson, R., Jonsson, M., Berggren, M., Crispin, X., (2016). Ionic thermoelectric supercapacitors. *Energy & Environmental Science,* 9 (4), 1450-1457, Zhao, D., Wang and others disclose that temperature gradient can be converted into molecular concentration gradient in a solution through thermal diffusivity effect (Soret effect) and causes a thermoelectric voltage. The thermoelectric voltage is determined according to ionic Seebeck coefficient $\alpha_i$ and thermal gradient $\Delta T$ across the electrolyte. Thus far, ionic thermoelectric supercapacitor (ITESC) has converted thermal energy into stored electric charges by ionic Soret effect, thereby providing a new way to collect energy from an intermittent heat source. Compared with a conventional thermoelectric generator, ITESC can convert and store more energy.

SUMMARY OF THE INVENTION

Conventional heat capacitors are structurally complicated to the detriment of ease of manufacturing and cost effectiveness. In order to overcome the aforesaid drawbacks of the prior art, it is an objective of the present disclosure to provide a heat capacitor which is structurally simple, easy to manufacture, and has high thermoelectric conversion efficiency with a view to achieving high-efficiency manufacturing, low cost and an alternative green energy source.

An aspect of the present disclosure provides a heat capacitor, comprising: a pair of electrodes, at least one said electrode being a carbonaceous electrode; and a thermoelectric electrolyte disposed between the pair of electrodes, wherein the distance between the pair of electrodes is at most 1 mm.

According to an embodiment of the present disclosure, the carbonaceous electrode is made of graphene, carbon nanotubes, nano-, micro- or meso-porous pure carbon film, composite carbon film, or a combination thereof.

Considering the space between the pair of electrodes is very limited, it is difficult to place a thermoelectric electrolyte in the space. In an embodiment, the thermoelectric electrolyte is fluid or semifluid and is disposed between the pair of electrodes by being injected with a tiny needle or injector.

In yet another embodiment, the thermoelectric electrolyte is film. Optionally, the thermoelectric electrolyte is gel-like electrolyte. The gel-like electrolyte is absorbed by and anchored to a porous membrane. Then, the porous membrane is inserted into between the pair of electrodes. Alternatively, an electrode, a membrane which the electrolyte is absorbed by and anchored to, and another electrode are sequentially stacked up to form a heat capacitor.

According to another embodiment of the present disclosure, the heat capacitor further comprises a non-conductive package member surrounding and protecting the thermoelectric electrolyte, but this technical feature is not an essential technical feature of the present disclosure.

Regarding the other aspects of the present disclosure, some are described later, whereas some other can be inferred easily from the description or inferred from the implementation of the present disclosure. Every aspect of the present disclosure can be comprehended and accomplished by way of components specified in the appended claims and combinations thereof. Both the foregoing general description and the detailed description below are illustrative, rather than restrictive, of the present disclosure.

BRIEF DESCRIPTION OF THE DRAWINGS

The present disclosure is hereunder illustrated with embodiments in conjunction with the accompanying drawings, in which.

DETAILED DESCRIPTION OF THE INVENTION

Figure 1:
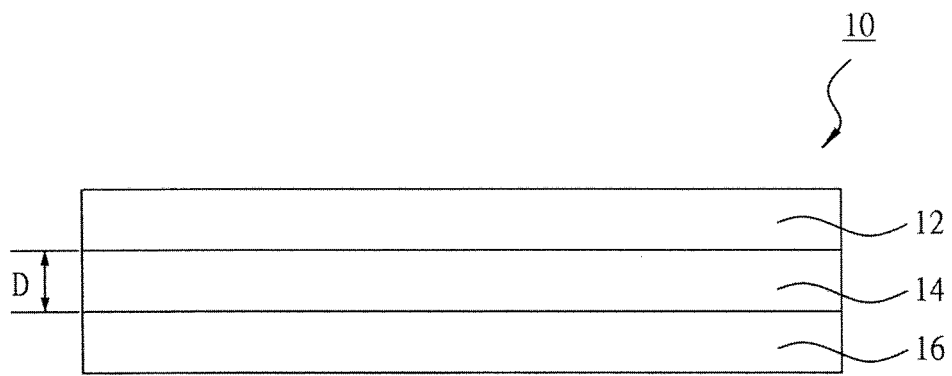
FIG. 1 is a cross-sectional view of a heat capacitor according to an embodiment of the present disclosure.

The present disclosure provides a heat capacitor with simple structure, easy to manufacture and high thermoelectric conversion efficiency with a view to achieving high-efficiency manufacturing, low cost and an alternative green energy source. The present disclosure is depicted with accompanying drawings and described below. In the accompanying drawings, like reference numerals denote like components. Devices, components and process steps in the embodiments described below are illustrative of the present disclosure rather than restrictive of the scope of the present disclosure.

Researchers had applied a low power solution, such as piezoelectric effect and magnetoelectric effect, to aid the power generation of thermoelectric devices. According to fundamental principles related to thermal energy and comprehensible to persons skilled in the art, temperature represents average energy of molecules and particles within a volume or region and corresponds to particles and molecules of different mass moving at different velocity, such that energy of the entire system is at equilibrium, where the average temperature is denoted by T.

$$E=m \cdot c^2 \quad (1)$$

Formula (1) expresses mass-energy equivalence proposed by Albert Einstein, suggesting that energy is intrinsically work, wherein work is the product of force and distance, and force is the product of mass and acceleration. For the sake of illustration, distance is set to one meter, time to one second, and energy to one watt. Formula (1) is converted into formula (2) below.

$$E=Q=1 \text{ watt}=m \cdot a \quad (2)$$

Referring to formula (2), when two particles or molecules of different mass receive the same amount of energy, the lighter particle or molecule moves with a greater acceleration and to a greater distance. Therefore, particles or molecules of low mass have high diffusivity rate.

The analysis below is based on the assumption that a heat capacitor has small particles/molecules carrying positive electric charges and large particles/molecules carrying negative electric charges. If the top of the heat capacitor is heated up, the heat capacitor will have a temperature difference in its entirety, the small particles carrying positive electric charges will move quickly and thus diffuse to the bottom surface to form a uniform layer, but most large molecules carrying negative electric charges will stay and stack up on the top. As a result, the bottom and top surfaces generate electrostatic charges by induction in the presence of particles carrying positive and negative electric charges, respectively. The aforesaid process is performed repeatedly until the positive and negative electric charges stack up and accumulate on the top and bottom surfaces. Therefore, a bilayer capacitor with sufficient electric charges is formed.

If diffusion length of cations (i.e., the distance traveled by cations to the negative electrode in the heat capacitor) is reduced, electric charge accumulation speed will increase. The increase in the electric charge accumulation speed is conducive to timely, effective creation of internal electric field and separation of electric charges (cations and anions). When one of the two electrodes is heated up, cations (i.e., mobile ions) diffuse out of the heated electrode to thereby move away therefrom and adsorb large anions within a negative potential range. As the reduction in the diffusion length continues, some cations take less time to reach the cold electrode, thereby creating internal electric field between the two electrodes. However, at this point in time, the electric field between the two electrodes is not at equilibrium and requires redistribution of electric charges in order for the electric field to be at equilibrium. Upon the redistribution of electric charges, a bilayer structure is formed in both the two electrodes, and the heat capacitor is charged. The reduction in the distance between the electrodes causes a reduction in the temperature difference required for completely charging a thermoelectric apparatus. Thus, the technical features in an embodiment of the present disclosure are applicable to a heat capacitor conducive to achievement of Seebeck/Soret effect greater than 100 my/K. Furthermore, a reduction in the distance between electrodes, whatever the type of the electrodes, enhances the efficiency of converting thermal energy into electrical energy. This kind of synergy also occurs to electrolyte redox couple, ferrocyanide and ferricyanide.

FIG. 1 is a cross-sectional view of a heat capacitor according to an embodiment of the present disclosure. The heat capacitor 10 comprises: a pair of electrodes 12, 16, at least one of which is a carbonaceous electrode; and a thermoelectric electrolyte 14 disposed between the pair of electrodes 12, 16, wherein the distance between the pair of electrodes is at most 1 mm.

For the sake of illustration, the present disclosure provides a specific embodiment intended to illustrate the feasibility of the embodiment of FIG. 1 rather than limit the claims of the present disclosure. First, a pair of glass substrates disposed opposite to each other are provided.

Preferably, the pair of glass substrates are parallel. After that, conductive carbon paste is coated on opposite surfaces of the pair of glass substrates, respectively, to function as a pair of electrodes 12, 16 of the heat capacitor 10. Next, a seal layer is formed at the periphery of the glass substrates and fixes the distance between the opposing substrates, such that a space is formed between the electrodes 12, 16. The distance between the electrodes 12, 16 is at most 1 mm, at most 0.9 mm, or at most 0.8 mm. Finally, the thermoelectric electrolyte 14, which is fluid, is injected into the space between the opposing substrates (i.e., the pair of electrodes 12, 16) with an injector to form the heat capacitor 10.

The heat capacitor 10 will work, provided that one of the electrodes 12, 16 is made of carbonaceous materials; however, the electrodes 12, 16 described above merely serve an exemplary purpose and thus are not restrictive of the present disclosure. The carbonaceous materials include all materials related to carbon, including carbon-like materials, carbon-containing materials, and pseudo-carbon materials.

In an embodiment of the present disclosure, the carbonaceous electrode comprises, but is not limited to, graphene, carbon nanotubes, nano-, micro- or meso-porous composite carbon film or pure carbon film. The meso-materials disclosed herein must be interpreted to include most carbon materials. Not all the electrodes are necessarily made of pure carbon materials; instead, the electrodes may be made of carbon-containing composite.

Although metallic electrodes are provided in an embodiment of the present disclosure, the metallic electrodes are less satisfactory than carbonaceous electrodes. In an embodiment of the present disclosure, the major advantage of carbonaceous electrodes (for example, activated carbon) lies in porosity of carbon particles. When carbon particles are activated, their porosity and high surface area enable them to adsorb more ions and thus accumulate or store more electric charges, so as to be prepared to discharge.

In an embodiment of the present disclosure, the structure and porosity of carbonaceous electrodes is described in terms of nano-, micro- or meso-porosity with a view to defining the corresponding heat capacitor structure. For example, nano-porous carbon electrodes are made of carbon and have nanoscale tunnels and pores to increase the specific area of the electrodes and thus enhance the performance of electrolytes. The expression "meso-" refers to any dimensions greater than "micro-", for example, millimeter, a unit of length.

In an embodiment of the present disclosure, carbonaceous composite electrodes are doped with a transition metal oxide (for example, $MnO_2$). The transition metal oxide disclosed herein is illustrative, rather than restrictive, of the present disclosure. Preferably, in an embodiment of the present disclosure, the electrodes can be covered with graphene, graphene oxide, carbon nanotubes, activated carbon, glass carbon, graphite or a combination thereof.

Figures 2A, 2B:
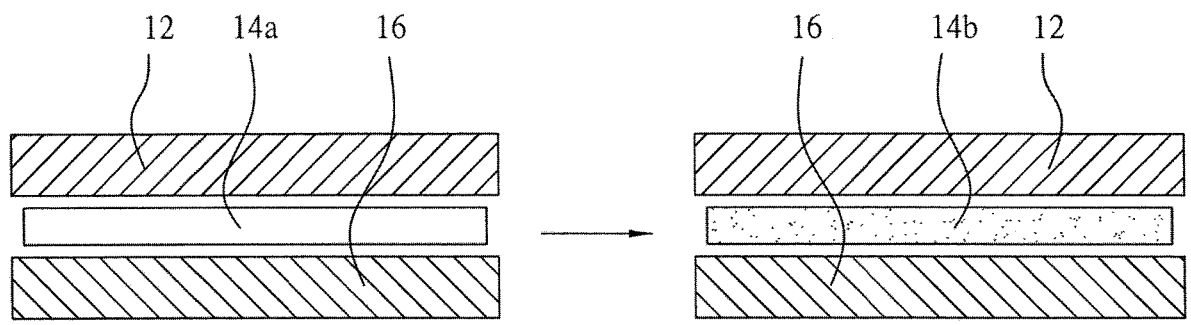
FIG. 2A and FIG. 2B are schematic views of how to form impregnated gel-like electrolyte according to an embodiment of the present disclosure.

FIG. 2A and FIG. 2B are schematic views of how to form impregnated gel-like electrolyte according to an embodiment of the present disclosure. For example, a membrane 14a is impregnated with gel-like electrolyte, such that the electrolyte is absorbed by and anchored to the membrane 14a. In an embodiment, the membrane 14a is a porous cellulose membrane (model number: TF4035) developed by NKK. The gel-like electrolyte is absorbed by and anchored to the cellulose membrane. Then, a gel-like electrolyte-containing membrane 14b is inserted into between the electrodes 12, 16. The NKK-developed TF4035 membrane not only absorbs and anchors the electrolyte but also separates the electrodes to prevent the electrodes from coming into direct contact with each other, thereby functioning as a baffle for use in a conventional battery, capacitor or fuel battery.

In an embodiment, the membrane 14a can be dispensed with, but the use of a membrane can make the entire manufacturing process simple if the electrolyte is gel (highly viscous liquid). The purpose of the membrane is to absorb and anchor gel-like electrolyte. Therefore, the gel-like electrolyte-containing membrane 14b is directly inserted into between the electrodes 12, 16 to dispense with the step of forming a seal layer and injecting electrolyte.

The membrane and the electrolyte are different. The purpose of the membrane is to absorb and anchor electrolyte and separate the electrodes. The membrane advantageously reduces the manufacturing costs and simplifies the manufacturing process.

Water is regarded as an impurity to the electrolyte in an embodiment of the present disclosure. By contrast, the electrolyte in the thermoelectric system of another embodiment of the present disclosure contains a small amount of water. The electrolyte contains, but is not limited to, polyethylene glycol (PEG). The electrolyte is, but is not limited to, molten salt which comprises potassium hydroxide and rubidium hydroxide, including, but not limited to, PEG-LiOH, PEG-NaOH, PEG-KOH, PEG-RbOH, and PEG-CsOH.

In an embodiment of the present disclosure, electrolyte is, for example, low-molecular-weight PEG to form molten salt (alkali salt reacts with PEG to form molten salt) and undergo dehydration. In an alternative embodiment, for example, electrolyte is an aqueous solution of ferrous/ferrocyanide redox couple, an aqueous solution of iodide/iodine redox couple, or organic/inorganic salts soluble in a specific solvent. In the alternative embodiment, the electrolyte can be formed, provided that the salts are mixed and fixed together, such that cations and anions in the system, for example, water or dimethylformamide (DMF), wherein DMF is a common organic solvent for use in an energy storage system (such as a battery). In short, a specific amount of potassium hydroxide and PEG are mixed therein and heated up at a specific temperature and within a time period to enable a reaction therebetween, thereby attaining a suitable electrolyte. A trace of water remains in the electrolyte, regardless of how much water is removed.

Figure 3:
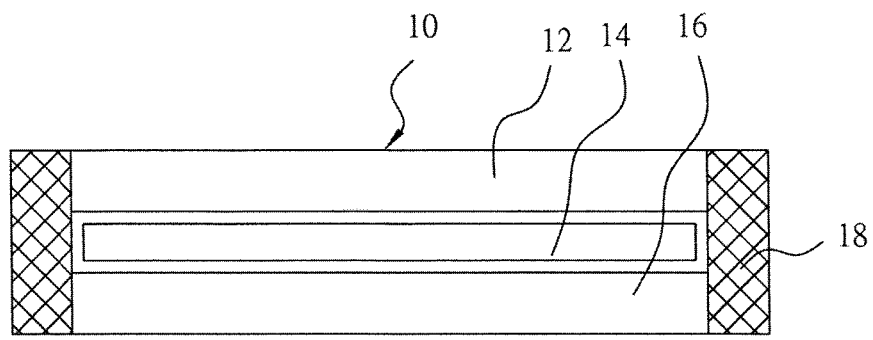
FIG. 3 is a cross-sectional view of the heat capacitor with a package member according to an embodiment of the present disclosure.

FIG. 3 is a cross-sectional view of the heat capacitor with a package member according to an embodiment of the present disclosure. Referring to FIG. 3, the heat capacitor 10 further comprises a non-conductive package member 18 surrounding and protecting the thermoelectric electrolyte. The package member 18 comprises a polymer, for example, acrylonitrile-butadiene-styrene (ABS) or polydimethylsiloxane (PDMS), but is not limited thereto.

The package member 18 can be made of any materials, provided that it is non-conductive and unlikely to cause the electrodes to short-circuit. Examples of the materials include rubber, plastic, polymeric aluminum, and ceramic, depending on the manufacturing process. For example, plastic like polyethene is not suitable for a high-temperature operation environment. Soft materials, such as plastic and homogeneous materials, are suitable for contact with the human skin.

An embodiment of the present disclosure provides a heat capacitor device. The heat capacitor device is a heat capacitor (G0.1 battery for short) formed by, for example, mounting a commercially-available carbon fabric and activated carbon on a copper substrate. The copper substrate functions as a current collector (collector for short) which is a thin metal plate attached to the electrodes to collect electric current from the battery fully. The carbonaceous electrodes are usually deposited on the copper foil to effect electrical contact. In this embodiment, even if the battery dispenses with a collector, the battery will work smoothly. Afterward, the NKK-developed TF4035 cellulose membrane fixes the distance between the electrodes, and PEG-KOH serves as the thermoelectric electrolyte, with a K-type thermoelectric couple adapted to measure and record temperature. During a test, the heat capacitor device is attached to a hot water bottle.

Figure 4A:
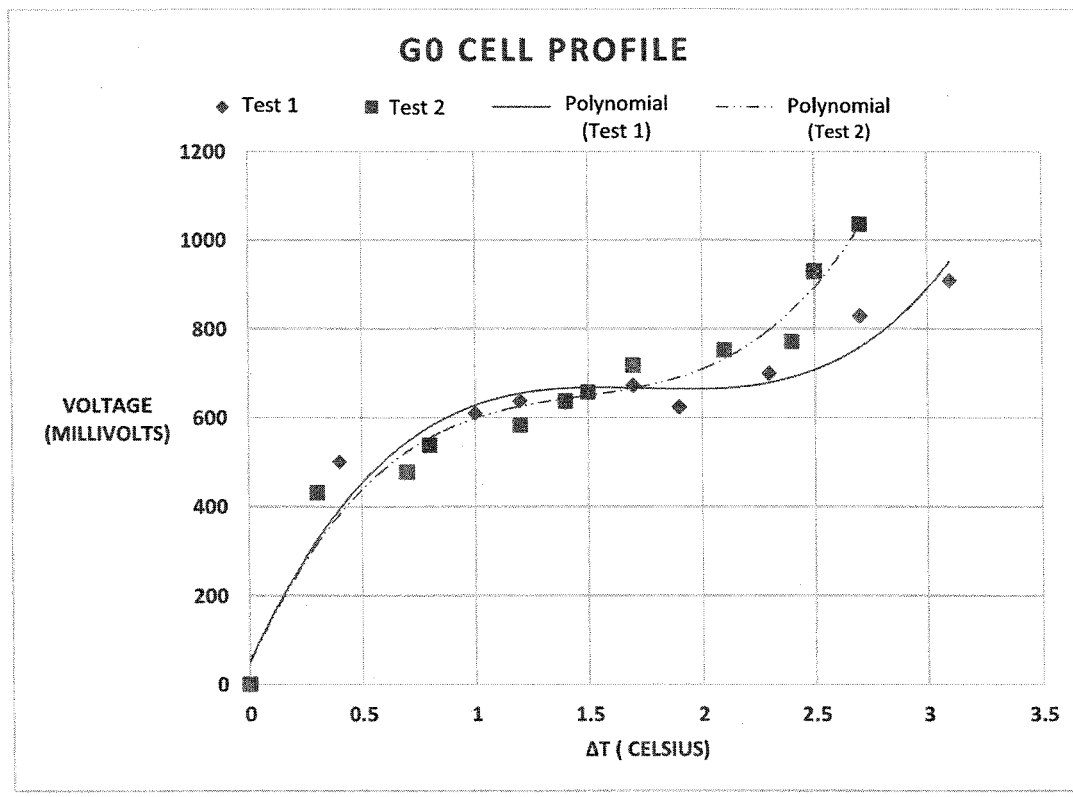
FIG. 4A is a voltage versus temperature difference graph of the heat capacitor according to an embodiment of the present disclosure.

FIG. 4A is a voltage versus temperature difference graph of the heat capacitor according to an embodiment of the present disclosure.

Figure 4B:
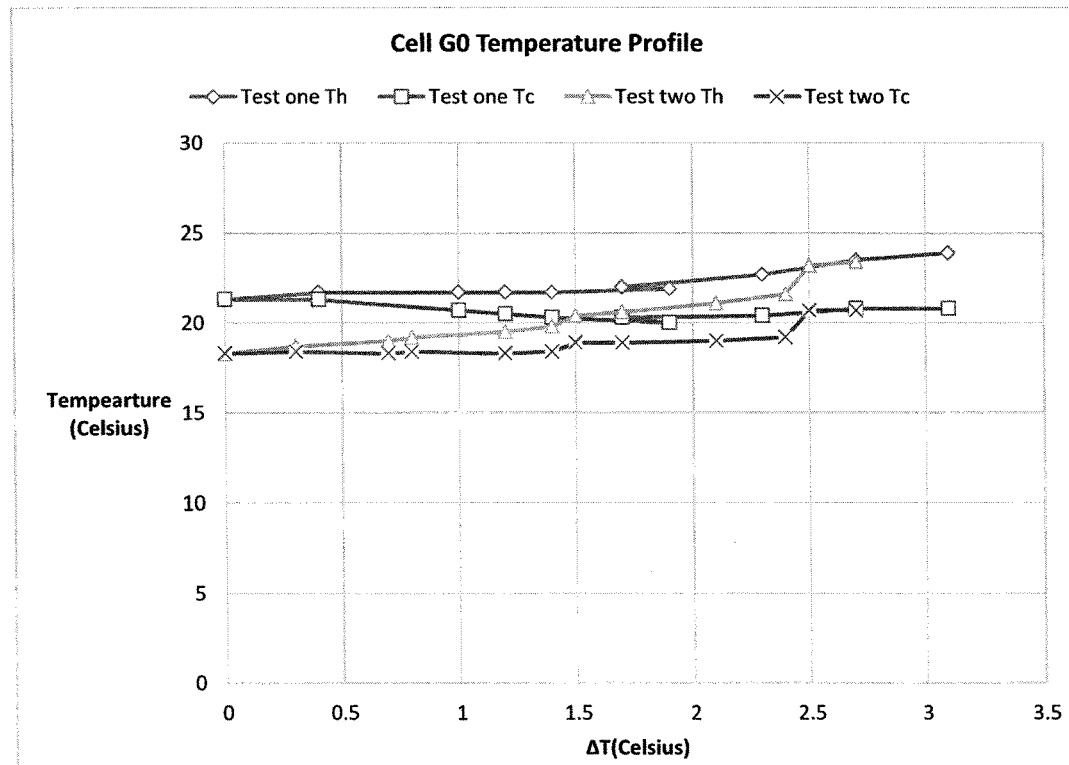
FIG. 4B is an actual temperature versus temperature difference graph of the heat capacitor according to an embodiment of the present disclosure.

FIG. 4B is an actual temperature versus temperature difference graph of the heat capacitor according to an embodiment of the present disclosure.

Figure 5:
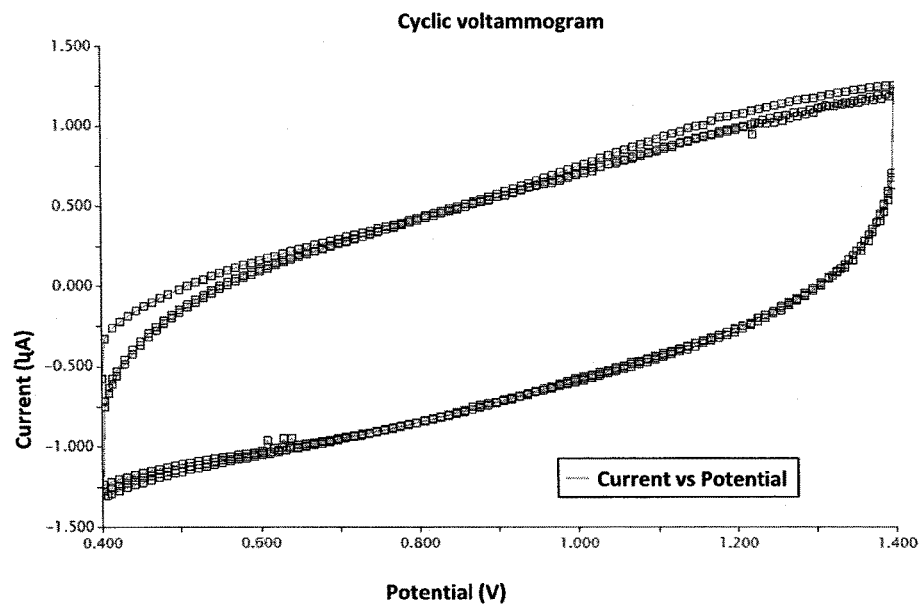
FIG. 5 is cyclic voltammogram of the heat capacitor according to an embodiment of the present disclosure.

For the sake of comparison with conventional data, the data of G0.1 battery is herein provided, such that G0.1 battery attains a capacitance of 1 µF. FIG. 5 is cyclic voltammogram of the heat capacitor according to an embodiment of the present disclosure.

In the embodiment illustrated by FIG. 5, the cyclic voltammogram of G0.1 battery is almost in rectangular shape, confirming the absence of bilayer capacitor mechanism of any chemical reaction.

Figure 6A:
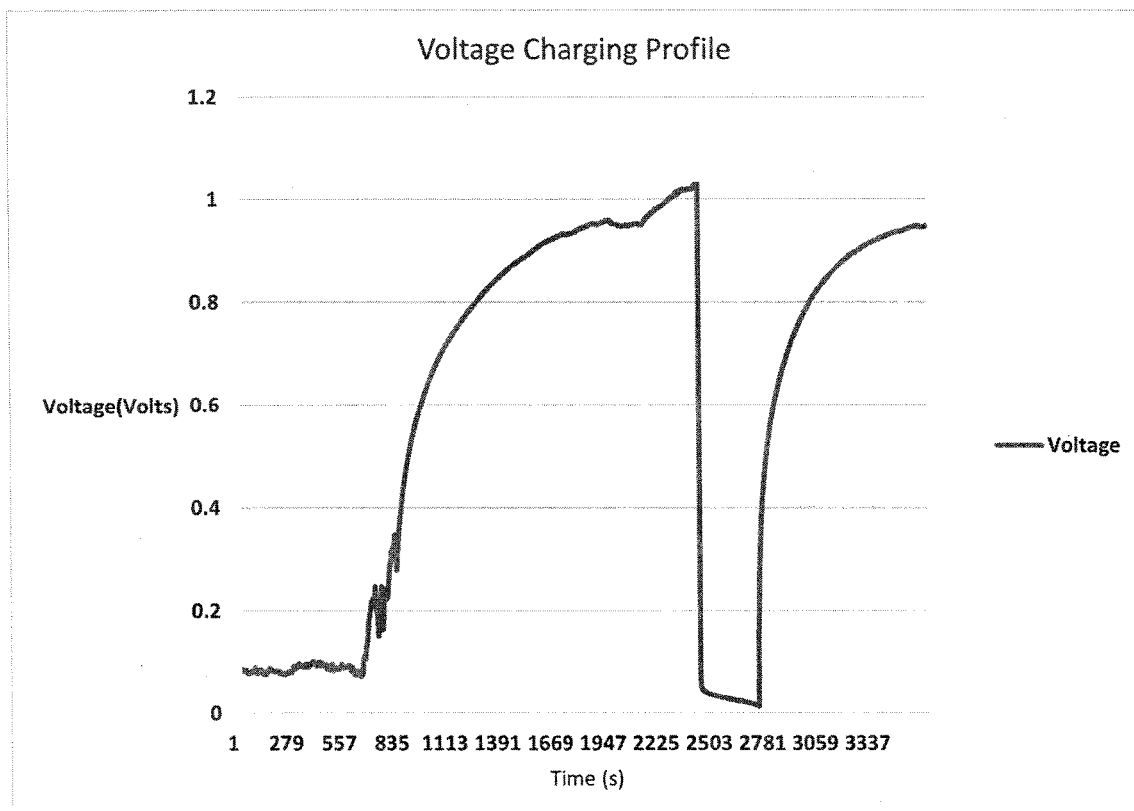
FIG. 6A and FIG. 6B are graphs of rapid kinetics of electric charge accumulation of the heat capacitor according to an embodiment of the present disclosure.
Figure 6B:
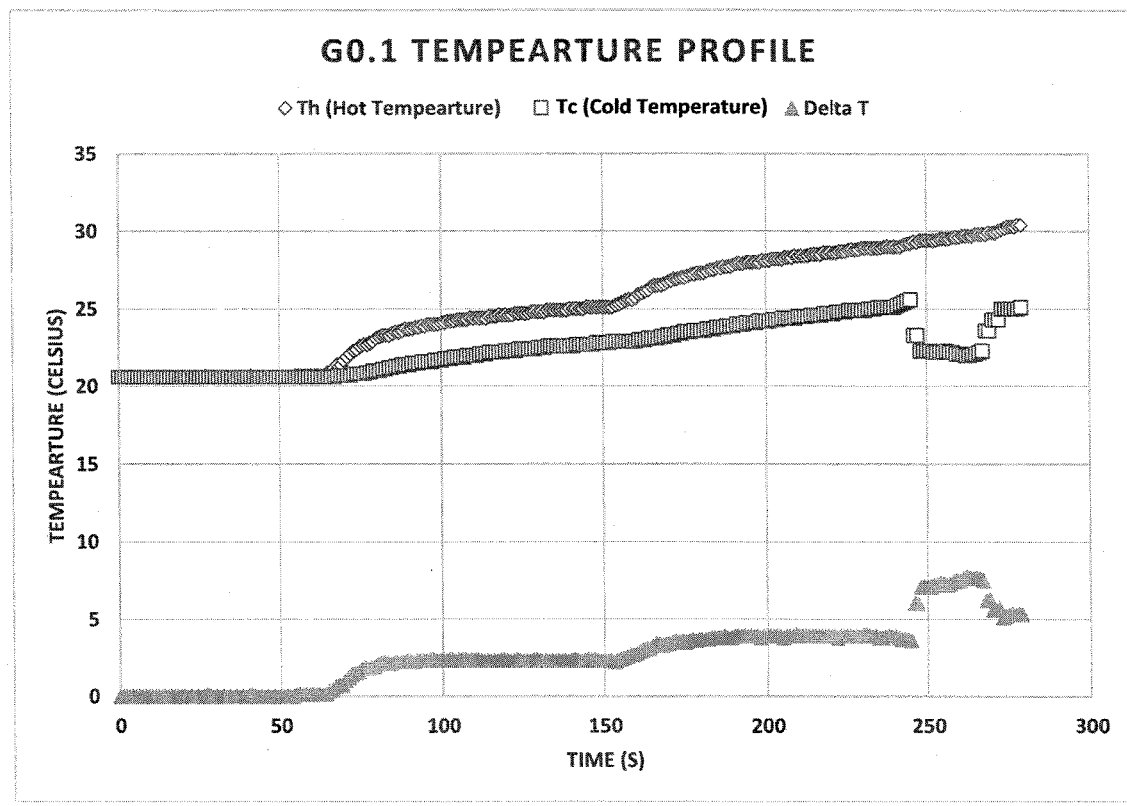

In an embodiment of the present disclosure, G0.1 battery is a structurally-simple, symmetrical battery and comprises unprocessed, commercially-available carbon fabric whose area is, for example, 4×5 cm$^2$, to function as a pair of electrodes in the presence of PEG-KOH electrolyte. FIG. 6A and FIG. 6B are graphs of rapid kinetics of electric charge accumulation of the heat capacitor according to an embodiment of the present disclosure. In the course of transient discharging, electric charges of the heat capacitor accumulate, anew and faster, at the fourth minute when compared to the first-instance charging. The foregoing result also confirms that this embodiment of the present disclosure does not require a thermodynamic cycle to regenerated and reactivate a battery.

Figure 7A:
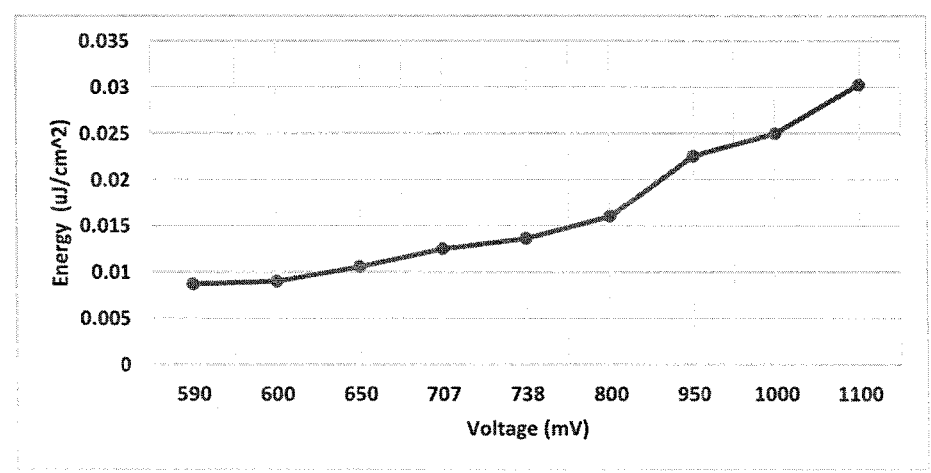
FIG. 7A through FIG. 7C are energy-voltage graph, current-voltage graph, and maximum power—voltage graph of the heat capacitor according to an embodiment of the present disclosure, respectively.
Figure 7B:
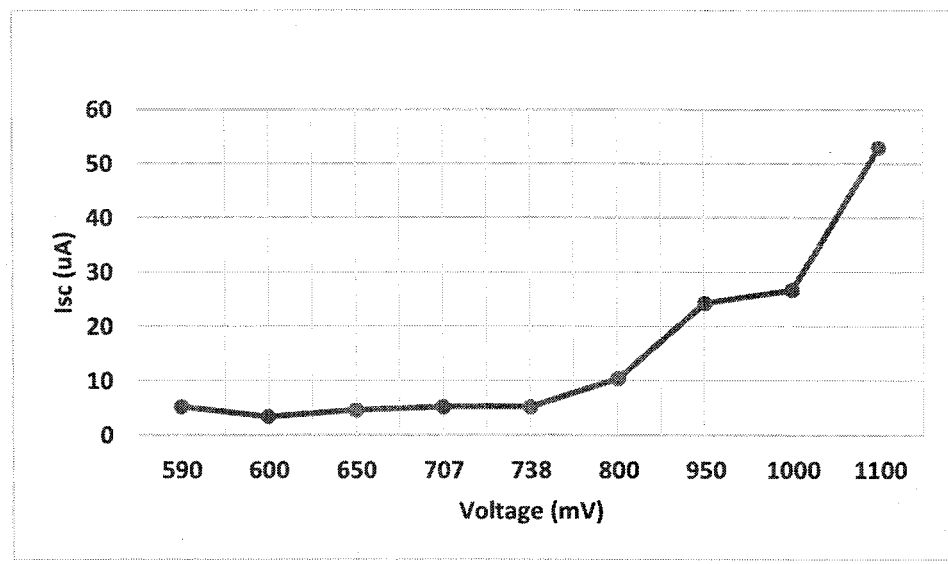
Figure 7C:
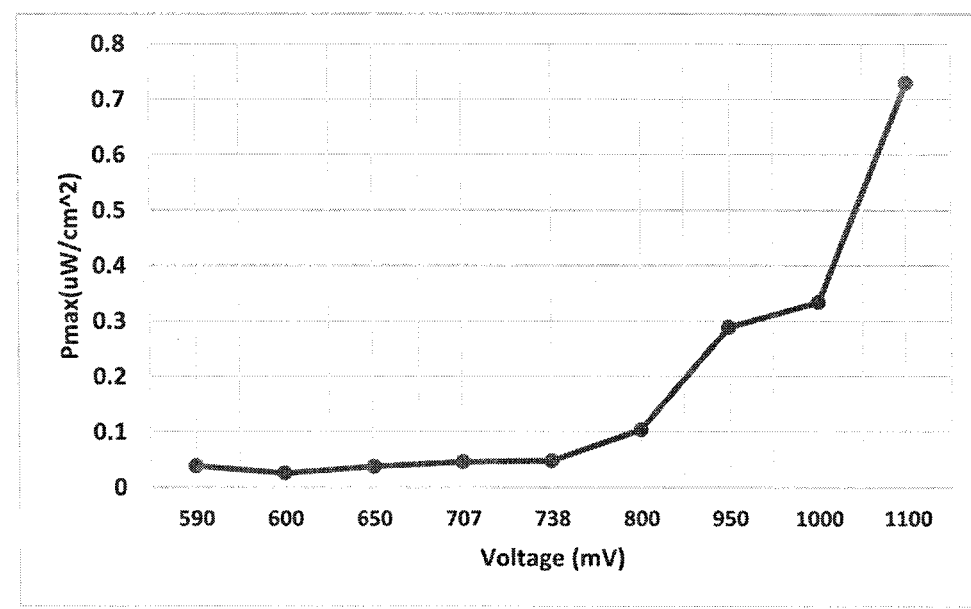

FIG. 7A through FIG. 7C are energy-voltage graph, current-voltage graph, and maximum power—voltage graph of the heat capacitor according to an embodiment of the present disclosure, respectively. FIG. 7A through FIG. 7C show the specific levels of power and energy of the heat capacitor when rated capacitance of the heat capacitor is around 1 µF.

Another important technical feature of the present disclosure is the electric charge retention rate after removal of heat.

Figure 8:
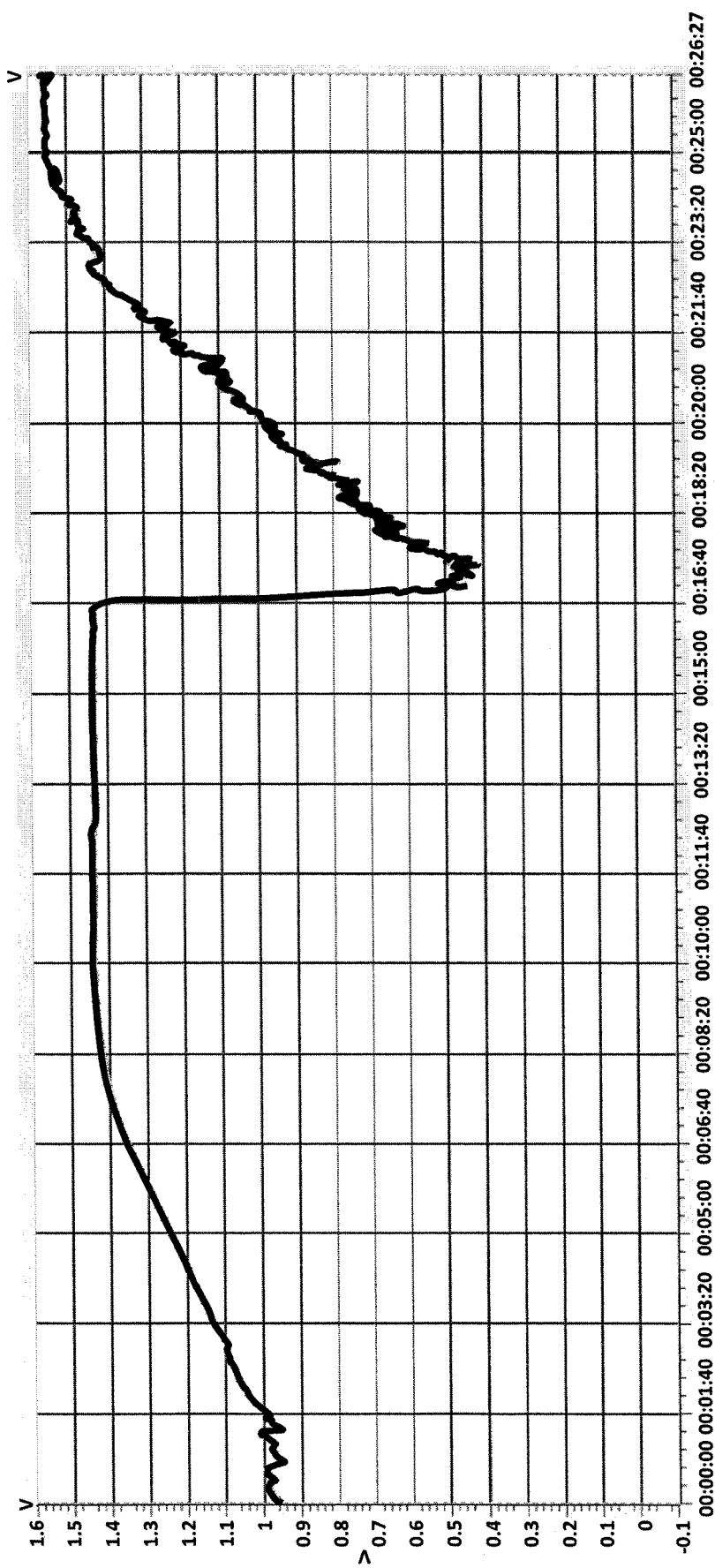
FIG. 8 is a graph of behavior of the heat capacitor after removal of a heat source according to an embodiment of the present disclosure.

FIG. 8 is a graph of behavior of the heat capacitor after removal of a heat source according to an embodiment of the present disclosure. Although the heat capacitor discharges spontaneously at the 16th minute, electric charges accumulate spontaneously to attain a higher voltage as well, thereby dispensing with any additional heat sources.

Assuming that capacitance has nothing to do with temperature, i.e., Q=CV. (Table 1 shows an estimation made visually.)

TABLE 1

|  | G0.1 battery (instant discharging) | G0.1 battery (discharging which follows equilibrium in 600 seconds) |
|---|---|---|
| $Q_{charging}$ (C) | 1 µC | 1 µC |
| $Q_{discharging}$ (C) | 1 µC | 1.5 µC |
| $Q_{discharging}/Q_{charging}$ (%) | 100% | 150% |

In this embodiment, the electrolyte of the heat capacitor is not only non-volatile and non-toxic but also extremely stable at room temperature. Generation of current from a heat capacitor can be achieved by the use of cheap electrodes rather than expensive electrodes made of precious metals, for example, gold.

As regards the heat capacitor of the present disclosure, electrode surface area is an important factor. The electrodes are made of nano-scale or micro-scale carbon materials, for example, carbon nanotubes and activated carbon with high surface area. In another embodiment of the present disclosure, carbon fabric functions as electrodes.

Given the formula, $C=Q/V=\varepsilon A/d$, the capacitance of the battery depends on the area of electrodes and the distance between the electrodes, which in turn depend on the voltage and the amount of electric charges generated by each battery. However, these are only some of the factors in parameters, such as electric charge storage.

Electrochemical activated surface area (EASA) is another factor in electric charge storage. When some activated materials (for example, $MnO_2$) are deposited on electrodes (such as carbon fabric), their EASA allows admission of electrolyte to attain electric charge transfer and/or storage.

In an embodiment of the present disclosure, the heat capacitor comprises or does not comprise a membrane between two electrodes. The membrane is functionalized and shortens the distance between the electrodes. Intrinsically, the membrane merely functions as a short-distance element between the electrodes. Most importantly, the electrolyte transfers ions in a direction perpendicular to the electrodes. The electrolyte comprises, but is not limited to, alkali metal-containing molten salt which contains large counter-anions. In an embodiment of the present disclosure, the electrolyte is preferably chlorine-free. It is because, in the course of operation of the battery, chlorides tend to produce chlorine gas which is harmful to the human body and environment. The thickness of the electrode sandwich structure is less than 1 mm. In an embodiment of the present disclosure, the heat capacitor functions as a supercapacitor independently and operates together with a hot water bottle to collect electrical energy generated from the heat capacitor.

In an embodiment of the present disclosure, the heat capacitor device provided is characterized in that the distance between the electrodes is not greater than 1 mm. The diffusive length of cations is shortened, and the time required for the built up of electric double layer is reduced. In principle, it is preferable to achieve higher capacitance with more electric charges, the compact designs such as making series connection expand to the stacked battery, and new battery settles. At least one of the electrodes is made of highly conductive pseudo-carbon materials to increase the specific area of the electrodes and increase the contact area of the electrolyte. The capacitance retention rate is high, indicating that the heat capacitor maintains most of its performance with minimum reduction thereof even after going through thousands of cycles.

An embodiment of the present disclosure provides a membrane which is easy to manufacture and incurs low cost, especially when the electrolyte is not solid-state. The distance between the electrodes (for example, but is not limited to, 35 μm) is easily adjusted by producing or using membranes of different thickness. In particular, owing to the use of the molten salt electrolyte (for example, PEG-KOH), interaction of thermal energy is restricted to allowing only small cations to form large polymeric chain-structured anions and avoiding the use of harmful solvent and organic salt. Like a conventional battery, high viscosity is associated with low chance of leakage of electrolyte out of the system.

Although the present disclosure is disclosed above by various embodiments, the embodiments are not restrictive of the scope of the present disclosure. Changes and modifications made by persons skilled in the art to the embodiments without departing from the spirit and scope of the present disclosure must be deemed falling within the scope of the present disclosure. Accordingly, the legal protection for the present disclosure should be defined by the appended claims.

What is claimed is:

1. A thermoelectric electrochemical conversion device, comprising:
    a pair of electrodes configured to be applied with a temperature differential, at least one said electrode being a carbonaceous electrode; and
    a polymeric thermoelectric electrolyte disposed between the pair of electrodes, such that the applied temperature differential over said pair of electrodes makes mobile ions diffuse via the thermoelectric electrolyte towards a lower temperature electrode of the pair of electrodes in accordance with a Seebeck/Soret effect and generate a thermoelectric voltage,
    wherein a distance between the pair of electrodes is at most 1 mm.

2. The thermoelectric electrochemical conversion device of claim 1, wherein the carbonaceous electrode comprises graphene, carbon nanotubes, nano-, micro- or meso- porous pure carbon film, composite carbon film, or a combination thereof.

3. The thermoelectric electrochemical conversion device of claim 1, wherein the polymeric thermoelectric electrolyte is fluid or semifluid and is disposed between the pair of electrodes by injection.

4. The thermoelectric electrochemical conversion device of claim 1, wherein the polymeric thermoelectric electrolyte is gel.

5. The thermoelectric electrochemical conversion device of claim 4, further comprising a membrane disposed between the pair of electrodes, with the polymeric thermoelectric electrolyte absorbed by and anchored to the membrane.

6. The thermoelectric electrochemical conversion device of claim 1, wherein the polymeric thermoelectric electrolyte comprises anhydrous molten salt.

7. The thermoelectric electrochemical conversion device of claim 1, wherein the polymeric thermoelectric electrolyte comprises an alkali metal with large anions.

8. The thermoelectric electrochemical conversion device of claim 1, further comprising a non-conductive package member surrounding and protecting the polymeric thermoelectric electrolyte.

9. The thermoelectric electrochemical conversion device of claim 1, wherein the package member comprises a polymer.

10. The thermoelectric electrochemical conversion device of claim 9, wherein the polymer comprises ABS or PDMS.

* * * * *